US012695275B2

(12) United States Patent　　(10) Patent No.:　US 12,695,275 B2

Jo et al.　　(45) Date of Patent:　　　Jul. 28, 2026

(54) METHOD FOR ACTIVE STABILIZATIION OF AN INJECTION LOCKED LASER WITH AN OPTICAL BANDPASS FILTER

(71) Applicant: The Hong Kong University of Science and Technology, Hong Kong (CN)

(72) Inventors: Gyu Boong Jo, Hong Kong (CN); Peng Chen, Hong Kong (CN); Ziting Chen, Hong Kong (CN); Bojeong Seo, Hong Kong (CN); Mingchen Huang, Hong Kong (CN); Mithilesh Kumar Parit, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 546 days.

(21) Appl. No.: 18/551,591

(22) PCT Filed: Apr. 19, 2022

(86) PCT No.: PCT/CN2022/087701
　§ 371 (c)(1),
　(2) Date: Sep. 20, 2023

(87) PCT Pub. No.: WO2022/222927

PCT Pub. Date: Oct. 27, 2022

(65) Prior Publication Data

US 2024/0170925 A1　　May 23, 2024

Related U.S. Application Data

(60) Provisional application No. 63/176,903, filed on Apr. 20, 2021.

(51) Int. Cl.
　*H01S 5/40*　　　(2006.01)
　*H01S 3/10*　　　(2006.01)
　(Continued)

(52) U.S. Cl.
　CPC ........ *H01S 5/4006* (2013.01); *H01S 3/10092* (2013.01); *H01S 5/0687* (2013.01); *H01S 5/0064* (2013.01); *H01S 5/0071* (2013.01)

(58) Field of Classification Search
　CPC ... H01S 3/10092; H01S 5/4006; H01S 5/0687
　See application file for complete search history.

(56) References Cited

U.S. PATENT DOCUMENTS

| 5,027,360 A | 6/1991 | Nabors et al. |
| 6,359,913 B1 | 3/2002 | Lodenkamper |

(Continued)

FOREIGN PATENT DOCUMENTS

| CN | 1774844 A | 5/2006 |
| CN | 102013625 A | 4/2011 |

(Continued)

OTHER PUBLICATIONS

Ziting Chen et al. Active control of a diode laser with injection locking. arXiv:2105.11285. May 24, 2021.

(Continued)

*Primary Examiner* — James A Menefee

(74) *Attorney, Agent, or Firm* — Idea Intellectual Limited; Sam T. Yip

(57)　　　　ABSTRACT

A high-power single-frequency laser system and a method for implementing the same. The system and method require only a photodetector (110) and a narrow optical bandpass filter (108) to probe the spectral mode of slave laser (106), no additional bulky devices are required. The photodetector (110) and narrow optical bandpass filter (108) can be easily integrated into the beam path. The spectral mode of slave laser (106) is monitored through the reflected signal from the narrow-laser line filter (108), which is neither sensitive to beam alignment nor bandwidth limited. As a result, high spectral mode purity and low intensity noise of the slave (Continued)

100 laser (106) can be simultaneously obtained. The slave laser (106) can be locked even when the master laser (102) frequency is dynamically scanned over GHz range. The system and method can be applied in laser cooling and trapping of atoms towards degenerate dipolar quantum gases.

18 Claims, 8 Drawing Sheets

(51) Int. Cl.
    *H01S 5/00*         (2006.01)
    *H01S 5/0687*   (2006.01)

(56) References Cited

U.S. PATENT DOCUMENTS

| | | | | |
|---|---|---|---|---|
| 9,941,661 B1 | 4/2018 | Efimov et al. | | |
| 2003/0197917 A1* | 10/2003 | Yap | | G02F 2/002 |
| | | | | 359/330 |
| 2006/0215714 A1 | 9/2006 | Luo et al. | | |
| 2008/0018988 A1* | 1/2008 | Davidson | | H01S 5/4006 |
| | | | | 359/341.1 |
| 2008/0279230 A1* | 11/2008 | Dagenais | | H01S 5/06255 |
| | | | | 372/20 |
| 2013/0215916 A1* | 8/2013 | Kakizaki | | H01S 3/2251 |
| | | | | 372/21 |
| 2019/0310498 A1* | 10/2019 | Xu | | G02F 1/113 |
| 2023/0254044 A1* | 8/2023 | Cheng | | H01S 5/4006 |
| | | | | 398/43 |

FOREIGN PATENT DOCUMENTS

| | | | | |
|---|---|---|---|---|
| CN | 104821486 A | | 8/2015 | |
| CN | 107490918 A | * 12/2017 | | G02F 1/395 |
| CN | 208768074 U | | 4/2019 | |
| JP | 2000244045 A | | 9/2000 | |

OTHER PUBLICATIONS

Ziting Chen et al. Active control of a diode laser with injection locking using a laser line filter. Rev..Sci.Instrum. Dec. 20, 2021 vol. 92, 123005 ISSN:0034-6748.

International Search Report and Written Opinion of the corresponding PCT application No. PCT/CN2022/087701 mailed on Jul. 20, 2022.

Ong Jing Hao, Active Stabilization of an Injection Lock, Department of Physics, Faculty of Science, National University of Singapore, 2019.

R. D. Niederriter et al. Polarization purity for active stabilization of diode laser injection lock. Rev..Sci.Instrum. vol. 92 (8), 2021.

B. Saxberg, B. Plotkin-Swing, and S. Gupta, "Active stabilization of a diode laser injection lock," Rev. Sci. Instrum. 87, 063109 (2016).

C. E. Wieman and L. Hollberg, "Using diode lasers for atomic physics," Rev. Sci. Instrum. 62, 1-20 (1991).

R. Eng, J. Butler, and K. Linden, "Tunable diode laser spectroscopy: an invited review," Opt. Eng. 19, 196945 (1980).

V. Schäfer, C. Ballance, C. Tock, and D. Lucas, "Optical injection and spectral filtering of high-power ultraviolet laser diodes," Opt. Lett. 40, 4265-4268 (2015).

K. Komori, Y. Takasu, M. Kumakura, Y. Takahashi, and T. Yabuzaki, "Injection-locking of blue laser diodes and its application to the laser cooling of neutral ytterbium atoms," Jpn. journal applied physics 42, 5059 (2003).

T. Hosoya, M. Miranda, R. Inoue, and M. Kozuma, "Injection locking of a high power ultraviolet laser diode for laser cooling of ytterbium atoms," Rev. Sci. Instrum. 86, 073110 (2015).

Y. Shimada, Y. Chida, N. Ohtsubo, T. Aoki, M. Takeuchi, T. Kuga, and Y. Torii, "A simplified 461-nm laser system using blue laser diodes and a hollow cathode lamp for laser cooling of Sr," Rev. Sci. Instrum. 84, 063101 (2013).

C. Pagett, P. Moriya, R. Celistrino Teixeira, R. Shiozaki, M. Hemmerling, and P. W. Courteille, "Injection locking of a low cost high power laser diode at 461 nm," Rev. Sci. Instrum. 87, 053105 (2016).

V. Schkolnik, J. R. Williams, and N. Yu, "Generating 500 mW for laser cooling of strontium atoms by injection locking a high power laser diode," arXiv:2004.11732 (2020).

L. Goldberg, H. Taylor, J. Weller, and D. Bloom, "Microwave signal generation with injection-locked laser diodes," Electron. Lett. 19, 491-493 (1983).

X.-L. Pang, A.-L. Yang, C.-N. Zhang, J.-P. Dou, H. Li, J. Gao, and X.-M. Jin, "Hacking quantum key distribution via injection locking," Phys. Rev. Appl. 13, 034008 (2020).

T. K. Paraïso, I. De Marco, T. Roger, D. G. Marangon, J. F. Dynes, M. Lucamarini, Z. Yuan, and A. J. Shields, "A modulator-free quantum key distribution transmitter chip," NPJ Quantum Inf. 5, 1-6 (2019).

S. A. Diddams, J. C. Bergquist, S. R. Jefferts, and C. W. Oates, "Standards of time and frequency at the outset of the 21st century," Science 306, 1318-1324 (2004).

M. Takamoto, F.-L. Hong, R. Higashi, and H. Katori, "An optical lattice clock," Nature 435, 321-324 (2005).

N. Hinkley, J. A. Sherman, N. B. Phillips, M. Schioppo, N. D. Lemke, K. Beloy, M. Pizzocaro, C. W. Oates, and A. D. Ludlow, "An atomic clock with 10-18 instability," Science 341, 1215-1218 (2013).

H. Liu, M. Yin, D. Kong, Q. Xu, S. Zhang, and H. Chang, "Selection and amplification of a single optical frequency comb mode for laser cooling of the strontium atoms in an optical clock," Appl. Phys. Lett. 107, 151104 (2015).

G. Hadley, "Injection locking of diode lasers," IEEE J. Quantum Electron. 22, 419-426 (1986).

A. S. Tistomo and S. Gee, "Laser frequency fixation by multimode optical injection locking," Opt. Express 19, 1081-1090 (2011).

M. Lu, N. Q. Burdick, S. H. Youn, and B. L. Lev, "Strongly dipolar bose-einstein condensate of dysprosium," Phys. Rev. Lett. 107, 190401 (2011).

K. Aikawa, A. Frisch, M. Mark, S. Baier, A. Rietzler, R. Grimm, and F. Ferlaino, "Bose-einstein condensation of erbium," Phys. Rev. Lett. 108, 210401 (2012).

G. Schimmel, S. Janicot, M. Hanna, J. Decker, P. Crump, G. Erbert, U. Witte, M. Traub, P. Georges, and G. Lucas-Leclin, "Coherent beam combining architectures for high power tapered laser arrays," in High-Power Diode Laser Technology XV, vol. 10086 (International Society for Optics and Photonics, 2017), p. 100860O.

X. Zhang, J. Pouls, and M. C. Wu, "Laser frequency sweep linearization by iterative learning pre-distortion for FMCW LiDAR," Opt. Express 27, 9965-9974 (2019).

C. He, E. Hajiyev, Z. Ren, B. Song, and G.-B. Jo, "Recent progresses of ultracold two-electron atoms," J. Phys. B: At. Mol. Opt. Phys. 52, 102001 (2019).

A. J. Daley, "Quantum computing and quantum simulation with group-ii atoms," Quantum Inf. Process. 10, 865-884 (2011).

B. Song, Y. Zou, S. Zhang, C.-w. Cho, and G.-B. Jo, "A cost-effective high-flux source of cold ytterbium atoms," Appl. Phys. B 122, 1-7 (2016).

B. Seo, P. Chen, Z. Chen, W. Yuan, M. Huang, S. Du, and G.-B. Jo, "Efficient production of a narrow-line erbium magneto-optical trap with two-stage slowing," Phys. Rev. A 102, 013319 (2020).

C. Adams and A. Ferguson, "Tunable narrow linewidth ultra-violet light generation by frequency doubling of a ring Ti: sapphire laser using lithium tri-borate in an external enhancement cavity," Opt. Commun. 90, 89-94 (1992).

M. Pizzocaro, D. Calonico, P. C. Pastor, J. Catani, G. A. Costanzo, F. Levi, and L. Lorini, "Efficient frequency doubling at 399 nm," Appl. optics 53, 3388-3392 (2014).

* cited by examiner

<u>100</u>

Seeding beam

Injection-locked beam

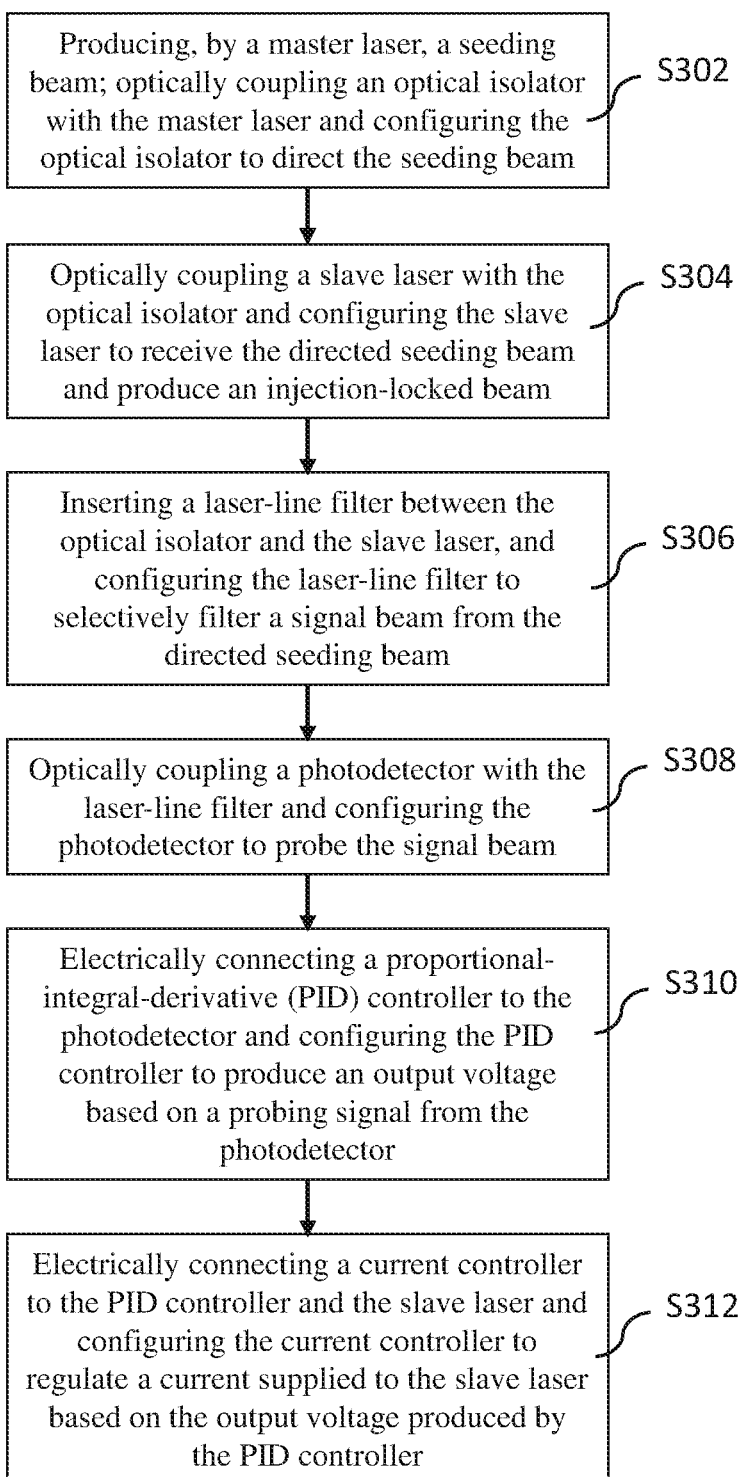

Producing, by a master laser, a seeding beam; optically coupling an optical isolator with the master laser and configuring the optical isolator to direct the seeding beam — S302

Optically coupling a slave laser with the optical isolator and configuring the slave laser to receive the directed seeding beam and produce an injection-locked beam — S304

Inserting a laser-line filter between the optical isolator and the slave laser, and configuring the laser-line filter to selectively filter a signal beam from the directed seeding beam — S306

Optically coupling a photodetector with the laser-line filter and configuring the photodetector to probe the signal beam — S308

Electrically connecting a proportional-integral-derivative (PID) controller to the photodetector and configuring the PID controller to produce an output voltage based on a probing signal from the photodetector — S310

Electrically connecting a current controller to the PID controller and the slave laser and configuring the current controller to regulate a current supplied to the slave laser based on the output voltage produced by the PID controller — S312

FIG. 3

METHOD FOR ACTIVE STABILIZATIION OF AN INJECTION LOCKED LASER WITH AN OPTICAL BANDPASS FILTER

FIELD OF THE INVENTION

The present invention relates to a simple method for active stabilization of an injection locked laser using an optical bandpass filter to provide a high-power single frequency laser source.

BACKGROUND OF THE INVENTION

Injection locking of a diode laser is essential in a majority of fields, such as laser spectroscopy, laser cooling and trapping, optical communication and high-precision metrology. It allows phase and frequency locking of a "slave" laser in reference to a "master" laser by an optical link. Among the advantages of using injection locking of the diode are its cost-effectiveness, flexibility and efficiency. For example, it offers a simple solution to provide a clean laser source without a special design of laser diodes or controllers. The spectral mode of injection locked slave laser is nearly dependent on the master laser. Most of single mode diode lasers, including some multimode diode lasers can be used for injection locking. This feature allows us to harness injection locking for achieving a relatively high-power narrow-linewidth diode laser source, without using an optical grating that causes significant optical loss. Beside above-said advantages, the injection locking scheme can also be exploited as an active optical filter in quantum optics.

In spite of its broad applications, it remains a challenge that an injection locked laser requires mechanically and thermally isolated environment otherwise necessitates an unpredictable relocking by a user. A major obstacle is the stability of injection locking which is hard to actively maintain. Environmental variations and current drifts of laser controller can frequently cause the slave laser out of lock. It is not convenient to manually re-lock the slave laser, especially for injection locking of multiple laser sources. In order to actively stabilize the injection locking, a Fabry-Perot interferometer (FPI) may be used to monitor a locking state of the slave laser by operating the FPI in a scanning mode to detect the spectral mode of the slave laser and thereby determine the locking state of the slave laser. However, FPI is sensitive to optical beam alignment and the scanning mode significantly sacrifices the detection bandwidth, making it unfavorable for general-purpose applications.

Recent developments in cooling non-alkali atoms for quantum simulation and computing require stable high-power narrow-linewidth laser sources at the wavelength of 400-500 nm. In early implementations, those laser sources are obtained by frequency doubling infrared lasers because of the limited power of the blue laser diode. The active locking scheme demonstrated in this work will provide a cost-effective way for cooling non-alkali cold atoms, such as ytterbium and erbium without using such a frequency doubling setup. In contrast to the laser system with a frequency doubling setup, the scheme provided by the present invention will greatly simplify potential application of compact injection locked lasers in modularized or integrated optical system.

SUMMARY OF THE INVENTION

According to one aspect of the present invention, a high-power single-frequency laser system is provided. The laser system comprises: a master laser configured for producing a seeding beam; an optical isolator optically coupled with the master laser and configured for directing the seeding beam; a slave laser optically coupled with the optical isolator and configured for receiving the directed seeding beam and producing an injection-locked beam; an optical bandpass filter inserted between the optical isolator and the slave laser, and configured for selectively filtering a signal beam from the directed seeding beam; a photodetector optically coupled with the optical bandpass filter and configured for probing the signal beam; a proportional-integral-derivative (PID) controller electrically connected to the photodetector and configured for producing an output voltage based on a probing signal from the photodetector; a current controller electrically connected to the PID controller and the slave laser and configured for regulating a current supplied to the slave laser based on the output voltage produced by the PID controller; and wherein the current supplied to the slave laser is actively controlled with a side-of-fringe scheme to stabilize a transmission power of the slave laser.

According to another aspect of the present invention, a method for implementing a high-power single-frequency laser source is provided. The method comprises: producing, by a master laser, a seeding beam; optically coupling an optical isolator with the master laser and configuring the optical isolator to direct the seeding beam; optically coupling a slave laser with the optical isolator and configuring the slave laser to receive the directed seeding beam and produce an injection-locked beam; inserting an optical bandpass filter between the optical isolator and the slave laser, and configuring the optical bandpass filter to selectively filter a signal beam from the directed seeding beam; optically coupling a photodetector with the optical bandpass filter and configuring the photodetector to probe the signal beam; electrically connecting a proportional-integral-derivative (PID) controller to the photodetector and configuring the PID controller to produce an output voltage based on a probing signal from the photodetector; electrically connecting a current controller to the PID controller and the slave laser and configuring the current controller to regulate a current supplied to the slave laser based on the output voltage produced by the PID controller. The current supplied to the slave laser is actively controlled with a side-of-fringe scheme to stabilize a transmission power of the slave laser.

As the system and method provided by the present invention require only a photodetector and a narrow optical bandpass filter to probe the spectral mode of slave laser, no additional bulky devices are required. The photodetector and narrow optical bandpass filter can be easily integrated into the beam path. The spectral mode of slave laser is monitored through the reflected signal from the narrow-laser line filter, which is neither sensitive to beam alignment nor bandwidth limited. As a result, high spectral mode purity and low intensity noise of the slave laser can be simultaneously obtained. The slave laser can be locked even when the master laser frequency is dynamically scanned over GHz range. The disclosed system and method can be generally applied in laser cooling and trapping of atoms. A promising scenario is coherent addition of multiple laser diodes for light power scaling, where injection locking plays a fundamental role.

BRIEF DESCRIPTION OF THE DRAWINGS

Aspects of the present disclosure may be readily understood from the following detailed description with reference to the accompanying figures. The illustrations may not necessarily be drawn to scale. That is, the dimensions of the various features may be arbitrarily increased or reduced for clarity of discussion. There may be distinctions between the artistic renditions in the present disclosure and the actual apparatus due to manufacturing processes and tolerances. Common reference numerals may be used throughout the drawings and the detailed description to indicate the same or similar components.

FIG. 3 shows a flowchart of a method for implementing a high-power single-frequency laser source according to some embodiments of the present invention;

DETAILED DESCRIPTION

In the following description, preferred examples of the present disclosure will be set forth as embodiments which are to be regarded as illustrative rather than restrictive. Specific details may be omitted so as not to obscure the present disclosure; however, the disclosure is written to enable one skilled in the art to practice the teachings herein without undue experimentation.

Figure 1:
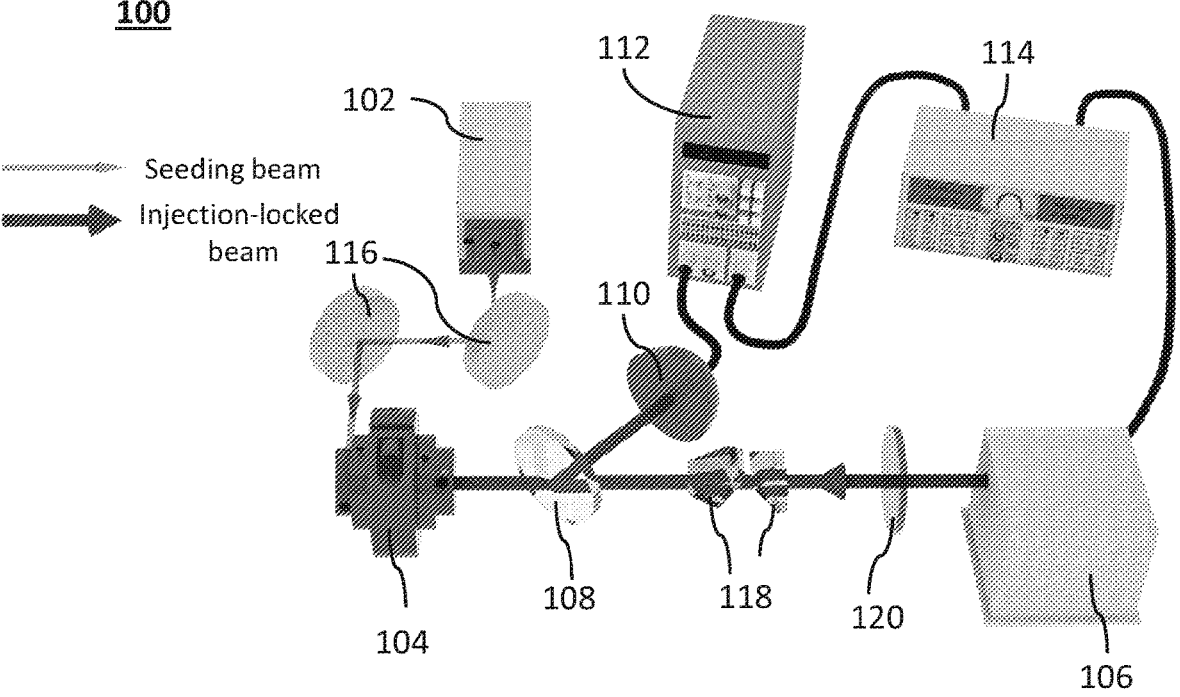
FIG. 1 shows a schematic diagram of a high-power narrow-linewidth laser system 100 according to some embodiments of the present invention.

FIG. 1 shows a schematic diagram of a high-power narrow-linewidth laser system 100 according to some embodiments of the present invention. As shown, the high-power narrow-linewidth laser system 100 may comprise a master laser 102 configured for producing a seeding beam; an optical isolator 104 optically coupled with the master laser 102 and configured for directing the seeding beam; a slave laser 106 optically coupled with the optical isolator 104 and configured for receiving the directed seeding beam and producing an injection-locked beam; an optical bandpass filter 108 inserted between the optical isolator 104 and the slave laser 106, and configured for selectively filtering a signal beam from the injection-locked beam; a photodetector 110 optically coupled with the optical bandpass filter and configured for probing the signal beam; a PID controller 112 electrically connected to the photodetector 110 and configured for producing an output voltage based on a probing signal from the photodetector 110; and a current controller 114 electrically connected to the controller 112 and the slave laser 106 and configured for regulating a current supplied to the slave laser 106 based on the output voltage produced by the PID controller 112.

Preferably, the high-power narrow-linewidth laser system 100 may further comprise a pair of mirrors 116 inserted between the mater laser 102 and the optical isolator 104, and configured for aligning the seeding beam.

Preferably, the high-power narrow-linewidth laser system 100 may further comprise a pair of prims 118 inserted between the slave laser 106 and the optical bandpass filter 108, and configured for shaping beam profile of the injection-locked beam.

Preferably, the high-power narrow-linewidth laser system 100 may further comprise a half-wave plate 120 inserted between the slave laser 106 and the pair of prims 118, and configured for controlling or adjusting the polarization of the injection-locked beam coming from the slave laser 106.

In some embodiments, the master laser 102 may be a tunable external cavity diode laser having a tunable spectral coverage from 369 nm to 1770 nm. The optical isolator 104 may be a polarization dependent isolator having a center wavelength at 405 nm and a tuning range from 390 nm to 420 nm. The slave laser 106 may be a laser diode having a typical peak wavelength 405 nm. The optical bandpass filter 108 may be a laser-line filter having a full width at half maximum (FWHM) bandwidth of 1.5 nm at a central wavelength 405 nm. The photodetector 110 may be a Silicon amplifier photodetector having a wavelength range from 320 nm to 1100 nm.

In some embodiments, the optical bandpass filter 108 may be slightly rotated in order to shift a central frequency (e.g., from 405 nm to 401 nm). The rotation angle is determined by minimizing the reflective power of the seeding light beam.

Figure 2A:
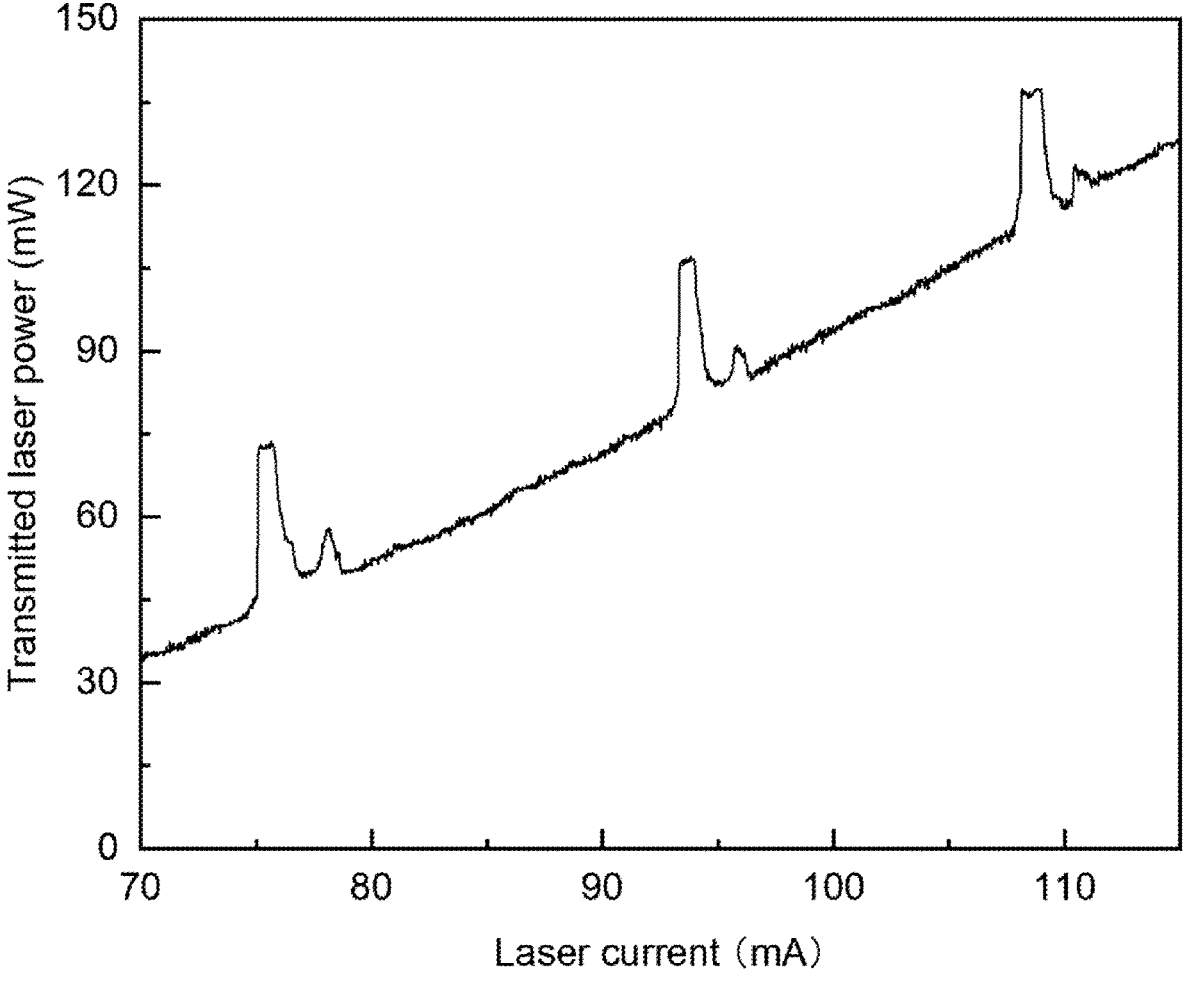
FIG. 2A shows a typical transmitted laser power-current curve from an injected laser diode.
Figure 2B:
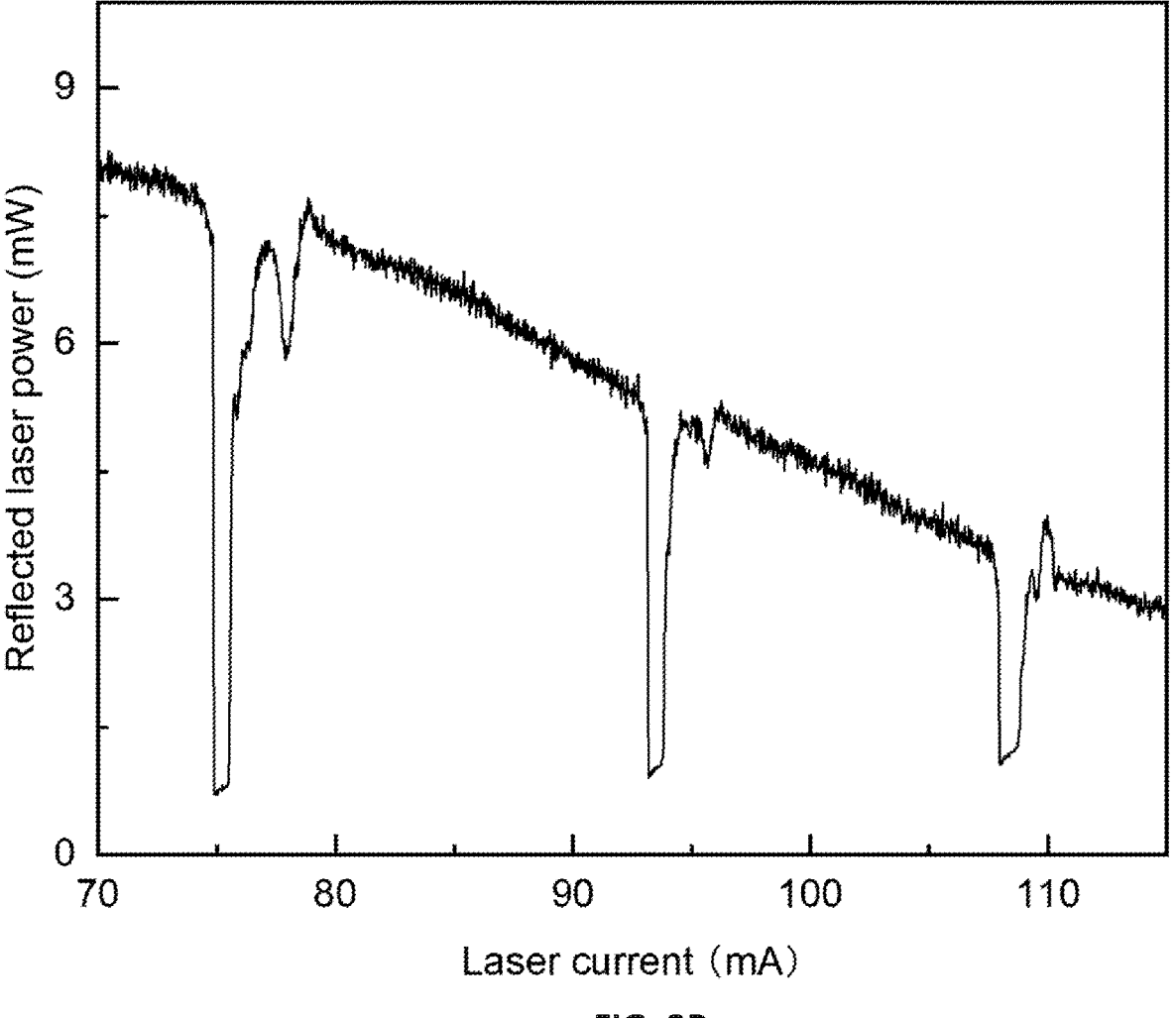
FIG. 2B shows a typical reflected laser power-current curve from an injected laser diode.

In some embodiments, the current supplied to the slave laser 106 may be actively controlled with a side-of-fringe scheme to stabilize a transmission power of the slave laser 106. FIG. 2A shows a typical transmitted laser power-current curve from an injected (or slave) laser diode (transmitted from an optical bandpass filter), where output power is enhanced only at certain currents. Those power spikes reflect that the internal cavity mode of the diode is resonant to the injection light. The shapes of spikes are asymmetrical due to the nonlinear response of lasing to the external injection light in contrast to the passive cavities, where the transmission follows a Lorenz curve. As the power spikes are correlated to injection locking, we can use them to monitor locking state of the diode laser. This can be done with a simple photodetector to monitor the laser power. The detection sensitivity can be further enhanced by a narrow optical bandpass filter, which typically has a transmission bandwidth of 2-3 nm and high optical density (OD) of a value greater than 5 for side bands rejection. The central transmission rate of optical bandpass filters can be also very high (e.g., >90%). The photodetector measures the reflection beam of the diode laser from the optical bandpass filter. With this detection geometry, a DC offset of the photodetector can be largely removed, resulting in an enhanced signal-noise ratio compared to monitoring the transmitted laser power, as shown in the reflected laser power-current curve in FIG. 2B.

To find an optimal injection locking current, one way is to search for a local minimum in the power-current curve, which indicates an injection locking point of the slave laser, conditioning that injection light frequency is within the transmission bandwidth. However, it is difficult to control the injected slave laser through the peak-locking because of the asymmetric current-power response including minimum plateaus. By noting that the locking state is less sensitive to the current on the right side of the power dip of reflected laser beam, side-of-fringe locking for active control of the slave laser current may be applied. In contrast to the peak-locking, the side-of-fringe locking does not require constant searching mode set by a special algorithm to search for optimal current for injection locking. Consequently, the active control scheme based on side-of-fringe locking can avoid an increase in the intensity noise of the slave laser without limiting the feedback bandwidth.

FIG. 3 shows a flowchart of a method for implementing a high-power single-frequency laser source according to some embodiments of the present invention. The method comprises the following steps:

S302: producing, by a master laser, a seeding beam; optically coupling an optical isolator with the master laser and configuring the optical isolator to direct the seeding beam;

S304: optically coupling a slave laser with the optical isolator and configuring the slave laser to receive the directed seeding beam and produce an injection-locked beam;

S306: inserting an optical bandpass filter between the optical isolator and the slave laser, and configuring the optical bandpass filter to selectively filter a signal beam from the directed seeding beam;

S308: optically coupling a photodetector with the optical bandpass filter and configuring the photodetector to probe the signal beam;

S310: electrically connecting a proportional-integral-derivative (PID) controller to the photodetector and configuring the PID controller to produce an output voltage based on a probing signal from the photodetector;

S312: electrically connecting a current controller to the PID controller and the slave laser and configuring the current controller to regulate a current supplied to the slave laser based on the output voltage produced by the PID controller. Preferably, the current supplied to the slave laser is actively controlled with a side-of-fringe scheme to stabilize a transmission power of the slave laser.

EXPERIMENTAL RESULTS

Figures 4A, 4B:
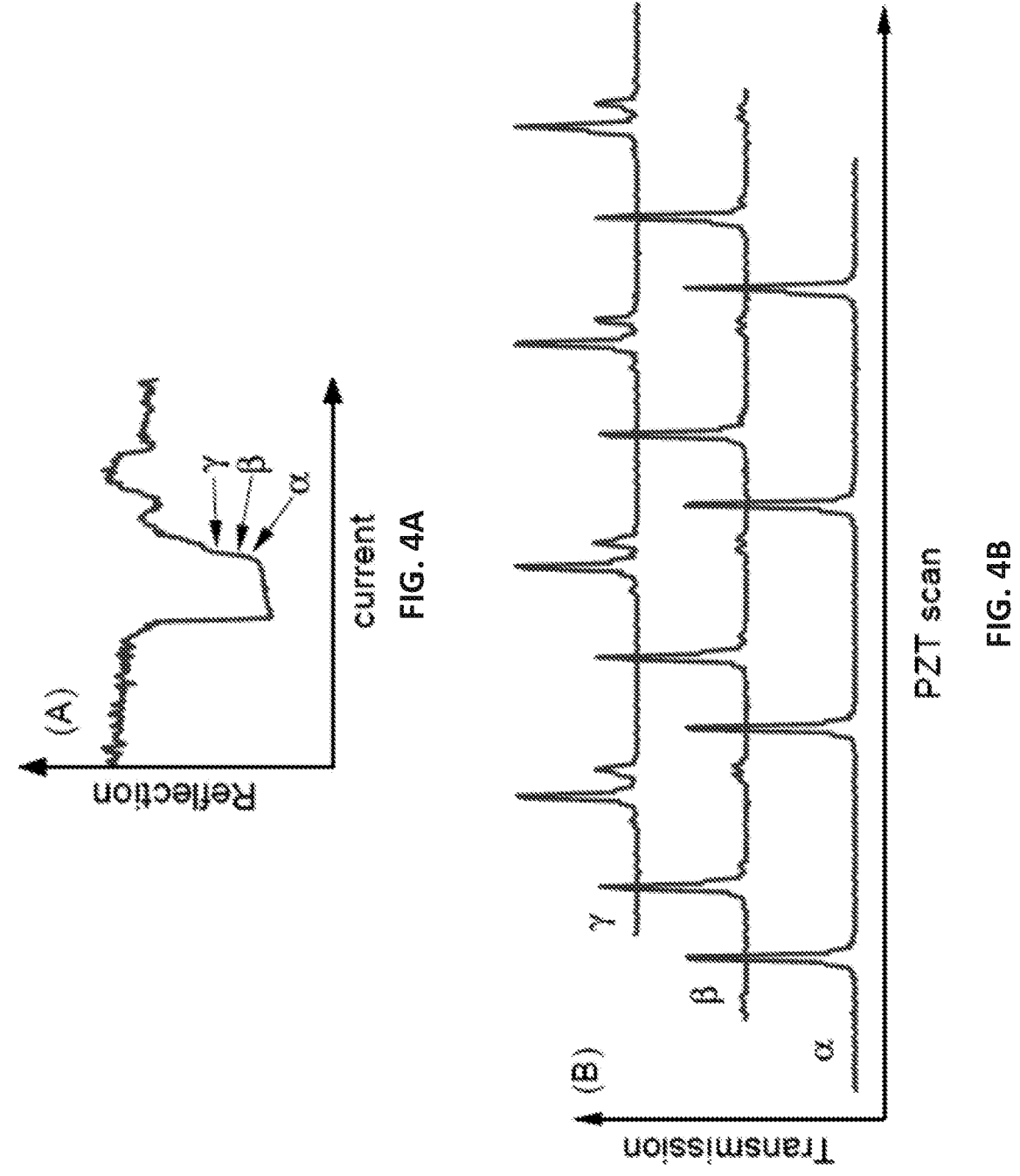
FIG. 4A shows a typical output reflection signal of a slave (injected) laser operating at 25° C. and 109 mA.
FIG. 4B shows spectral purity of the slave laser at three locking positions α, β and γ as indicated in FIG. 4A, respectively.

FIG. 4A shows a typical output reflection signal of a slave (injected) laser operating at 25° C. and 109 mA. FIG. 4B shows spectral purity of the slave laser at three locking positions α, β and γ as indicated in FIG. 4A, respectively. The spectral purity may be monitored with a Fabry-Perot interferometry (FPI) using lead zirconate titanate (PZT)-actuated scanning micromirrors. The injection locking is stabilized on the right side of the dip using the side-of-fringe locking. As shown in FIG. 4B, at a locking position α which is closest to the minimum of the reflection signal, the FPI measurement does not present any spurious modes, which suggests that the slave laser frequency is faithfully locked to the master laser. At a locking position β, spurious modes slightly show up and become more severe at a locking position γ, which deviates most from the dip minimum among three positions. These results demonstrate that injection locking can be maintained with a proper lock position using the side-of-fringe locking. The side-of-fringe locking-based active control scheme provided by the present invention can actively maintain injection locking at the laser power slightly higher than the minimum of the reflected laser power (e.g., the position «), and stabilize the power fluctuation of the slave laser.

Figure 5:
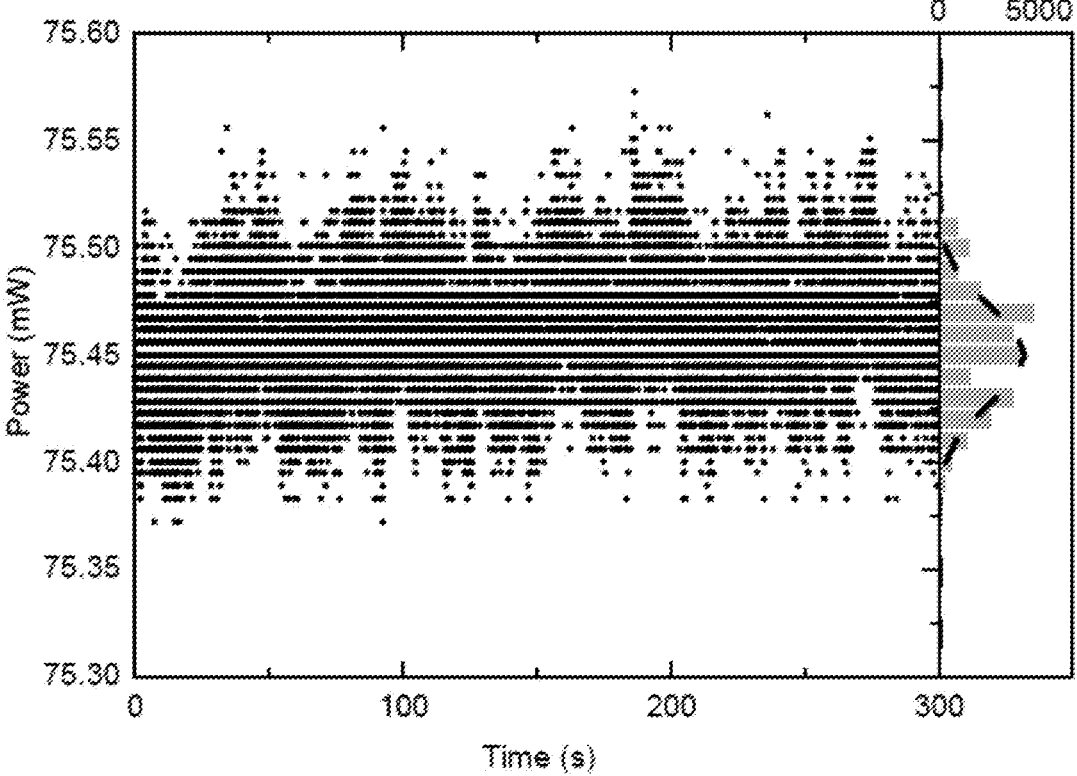
FIG. 5 shows the slave laser power transmitted from the optical bandpass filter in a course of 6 minutes measurement under the condition of injection locking with active control.
Figure 6:
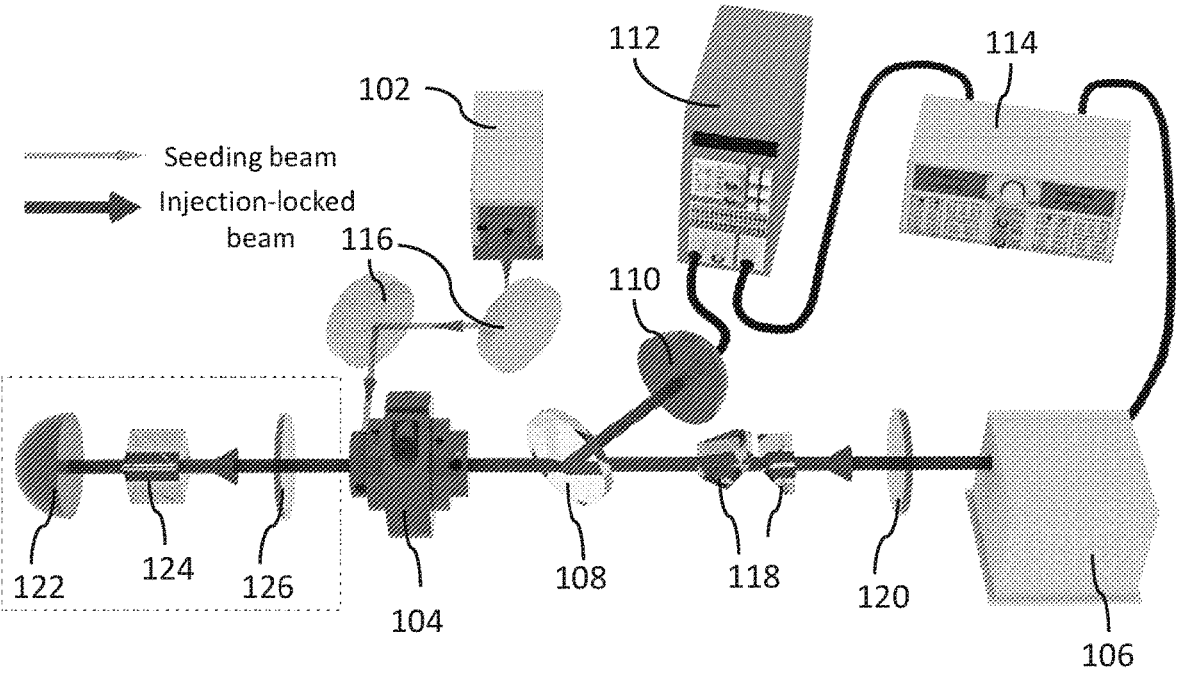
FIG. 6 shows an experimental setup for measuring the transmitted laser power of the slave laser.

FIG. 5 shows the slave laser power transmitted from the optical bandpass filter in a course of 6 minutes measurement under the condition of injection locking with active control. As shown in FIG. 6, the transmitted laser power may be measured by optically coupling an additional photodetector 122, a polarizing beam splitter 124 and an additional half-wave plate 126 with the isolator 104. Based on the measurement results, the ratio of the root-mean-square (rms) value of laser power fluctuations to the mean value of laser power, which indicates the power stability of the laser, is found to be approximately 0.06%. Compared to the slave laser power stability without the active control, which is about 0.08 to 0.1%, the active control scheme can not only stabilize the injection locking but also reduce the laser intensity noise.

Figure 7:
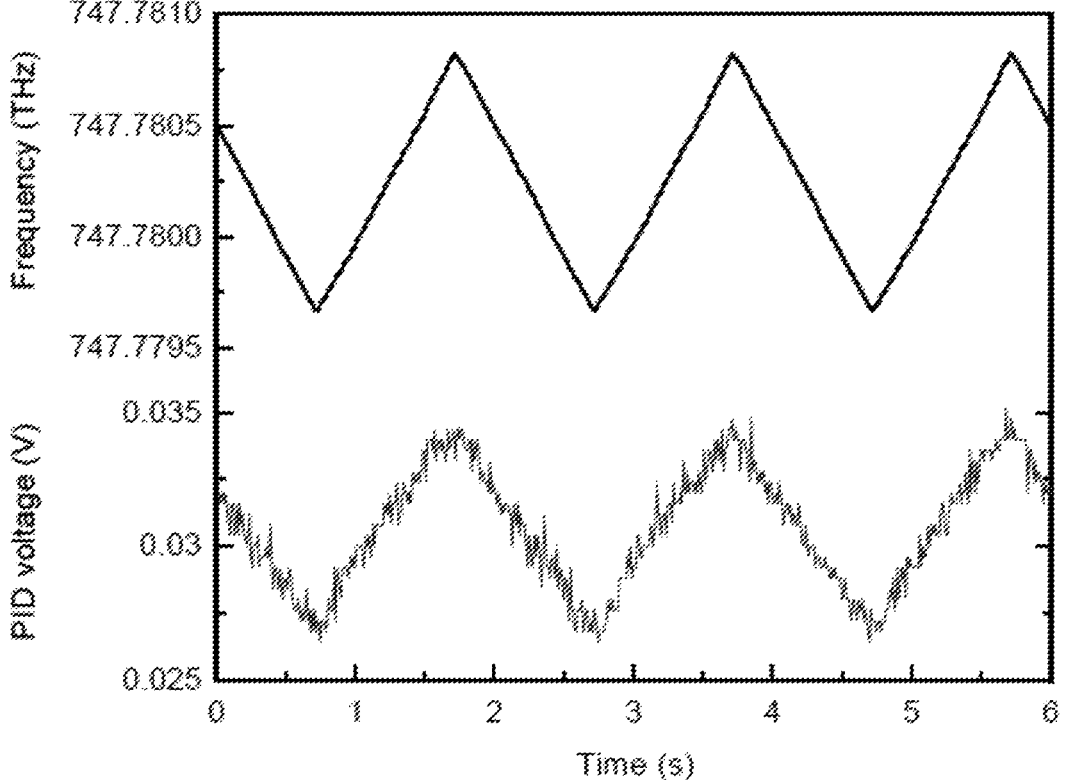
FIG. 7 shows the frequency of the slave laser and the output voltage from the PID controller when the master laser linearly scans over 1 GHZ.

Another advantage of the active control scheme is that the frequency of slave laser can be dynamically tuned by following the master laser frequency. FIG. 7 shows the wavelength (frequency) of the slave laser and the output voltage from the PID controller when the master laser linearly scans over 1 GHZ. The change of the injection locking point induced by the master laser is readily compensated by active feedback through which the current of the slave laser is controlled by the PID voltage in such a way that the slave laser properly follows the maser laser frequency. In contrast to the passive injection locking, the active control scheme provided by the present invention is useful for not only the wavelength (frequency) stabilization, but also dynamically tracking the injection locking states. This feature would be critical in applications where the slave laser frequency is also required to vary, for example, coherent light detection and ranging (LIDAR) for range detection. The feedback bandwidth of the locking scheme is mainly determined by the current controller of the slave laser.

The embodiments were chosen and described in order to best explain the principles of the invention and its practical application, thereby enabling others skilled in the art to understand the invention for various embodiments and with various modifications that are suited to the particular use contemplated. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations. While the apparatuses disclosed herein have been described with reference to particular structures, shapes, materials, composition of matter and relationships . . . etc., these descriptions and illustrations are not limiting. Modifications may be made to adapt a particular situation to the objective, spirit and scope of the present disclosure. All such modifications are intended to be within the scope of the claims appended hereto.

The invention claimed is:

1. A high-power single-frequency laser system, comprising:

a master laser configured for producing a seeding beam;

an optical isolator optically coupled with the master laser and configured for directing the seeding beam;

a slave laser optically coupled with the optical isolator and configured for receiving the directed seeding beam and producing an injection-locked beam;

an optical bandpass filter inserted between the optical isolator and the slave laser, and configured for selectively filtering a signal beam from the directed seeding beam;

a photodetector optically coupled with the optical bandpass filter and configured for probing the signal beam;

a proportional-integral-derivative (PID) controller electrically connected to the photodetector and configured for producing an output voltage based on a probing signal from the photodetector;

a current controller electrically connected to the PID controller and the slave laser and configured for regulating a current supplied to the slave laser based on the output voltage produced by the PID controller; and wherein the current supplied to the slave laser is actively controlled with a side-of-fringe scheme to stabilize a transmission power of the slave laser.

2. The high-power single-frequency laser system according to claim 1, further comprising a pair of mirrors inserted between the mater laser and the optical isolator, and configured for aligning the seeding beam.

3. The high-power single-frequency laser system according to claim 2, further comprising a pair of prims inserted between the slave laser and the optical bandpass filter, and configured for shaping beam profile of the injection-locked beam.

4. The high-power single-frequency laser system according to claim 3, further comprising a half-wave plate inserted between the slave laser and the pair of prims, and configured for adjusting the polarization of the injection-locked beam.

5. The high-power single-frequency laser system according to claim 1, wherein the master laser is a tunable external cavity diode laser.

6. The high-power single-frequency laser system according to claim 1, wherein the optical isolator is a polarization dependent isolator.

7. The high-power single-frequency laser system according to claim 1, wherein the slave laser is a laser diode.

8. The high-power single-frequency laser system according to claim 1, wherein the optical bandpass filter is a laser-line filter having a full width at half maximum of 1.5 nm.

9. The high-power single-frequency laser system according to claim 1, wherein the photodetector is a Silicon amplifier photodetector.

10. A method for implementing a high-power single-frequency laser source, comprising:

producing, by a master laser, a seeding beam; optically coupling an optical isolator with the master laser and configuring the optical isolator to direct the seeding beam;

optically coupling a slave laser with the optical isolator and configuring the slave laser to receive the directed seeding beam and produce an injection-locked beam;

inserting an optical bandpass filter between the optical isolator and the slave laser, and configuring the optical bandpass filter to selectively filter a signal beam from the directed seeding beam;

optically coupling a photodetector with the optical bandpass filter and configuring the photodetector to probe the signal beam;

electrically connecting a proportional-integral-derivative (PID) controller to the photodetector and configuring the PID controller to produce an output voltage based on a probing signal from the photodetector; and electrically connecting a current controller to the PID controller and the slave laser and configuring the current controller to regulate a current supplied to the slave laser based on the output voltage produced by the PID controller; and wherein the slave laser is actively controlled with a side-of-fringe scheme to stabilize a transmission power of the slave laser.

11. The method according to claim 10, further comprising inserting a pair of mirrors between the mater laser and the optical isolator, and configuring the pair of mirrors to aligning the seeding beam.

12. The method according to claim 11, further comprising inserting a pair of prims between the slave laser and the optical bandpass filter, and configuring the pair of prims to shape a beam profile of the injection-locked beam.

13. The method according to claim 12, further comprising inserting a half-wave plate between the slave laser and the pair of prims, and configuring the half-wave plate to adjust the polarization of the injection-locked beam.

14. The method according to claim 10, wherein the master laser is a tunable external cavity diode laser.

15. The method according to claim 10, wherein the optical isolator is a polarization dependent isolator.

16. The method according to claim 10, wherein the slave laser is a laser diode.

17. The method according to claim 10, wherein the optical bandpass filter has a full width at half maximum of 1.5 nm.

18. The method according to claim 10, wherein the photodetector is a Silicon free-space amplifier photodetector.

\* \* \* \* \*